US012628651B2

(12) United States Patent
Chen et al.

(10) Patent No.: US 12,628,651 B2
(45) Date of Patent: May 12, 2026

(54) ELECTRONIC PACKAGE, PACKAGE SUBSTRATE AND MANUFACTURING METHOD THEREOF

(71) Applicant: AaltoSemi Inc., Nanjing City (CN)

(72) Inventors: Min-Yao Chen, Nanjing City (CN);
Andrew C. Chang, Nanjing City (CN)

(73) Assignee: AaltoSemi Inc., Nanjing City (CN)

( * ) Notice: Subject to any disclaimer, the term of this patent is extended or adjusted under 35 U.S.C. 154(b) by 433 days.

(21) Appl. No.: 18/179,570

(22) Filed: Mar. 7, 2023

(65) Prior Publication Data

US 2023/0290744 A1 Sep. 14, 2023

(30) Foreign Application Priority Data

Mar. 11, 2022 (TW) .................................. 111109058

(51) Int. Cl.
*H10W 42/00* (2026.01)
*H10W 70/63* (2026.01)
(Continued)

(52) U.S. Cl.
CPC ......... *H10W 42/00* (2026.01); *H10W 70/685* (2026.01); *H10W 70/635* (2026.01);
(Continued)

(58) Field of Classification Search
CPC ............. H01L 23/49822; H01L 23/564; H01L 21/4857; H01L 24/48; H01L 24/49; H01L 24/19; H01L 21/561; H01L 23/49827; H01L 24/73; H01L 21/568; H01L 24/32; H01L 23/49503; H01L 23/3114; H01L 23/5389; H01L 23/49541; H01L 21/4803; H01L 23/585; H01L 25/105; H01L 23/525; H01L 24/92; H01L 2224/4903; H01L 2224/49052; H01L 2224/48228; H01L 2224/73267; H01L 2224/0401; H01L 2224/48227; H01L 2224/81005; H01L 2224/81815; H01L 2224/12105; H01L 2924/01015; H01L 2224/48247; H01L 2924/12042; H01L 2224/73265; H01L 2924/01047; H01L 2224/32245; H01L 2924/181; H01L 2224/45147; H01L 2224/48091; H01L 2224/45015; H01L 2224/83005; H01L 2224/32225; H01L 2224/94; H01L 2225/1058; G06V 40/1329; H10F 77/50; H10F 39/804; H10F 39/026; H10F 39/8063; H10F 39/8053
See application file for complete search history.

(56) References Cited

U.S. PATENT DOCUMENTS 5,756,380 A * 5/1998 Berg ........................ H01L 24/32
                                                         438/126
9,299,650 B1 * 3/2016 Chi .......................... H01L 25/50
(Continued)

*Primary Examiner* — Mouloucoulaye Inoussa
(74) *Attorney, Agent, or Firm* — Dority & Manning, P.A.

(57) ABSTRACT

An electronic package is provided, including a package substrate in which a circuit layer and a surface treatment layer are embedded in an insulating portion, and the surface treatment layer is coupled to a top surface of the circuit layer, but is not formed on a side surface of the circuit layer. Therefore, the circuit layer can maintain the original predetermined line spacing so that it is beneficial to be designed with fine line spacing/line width.

6 Claims, 4 Drawing Sheets

(51) Int. Cl.
    *H10W 70/685*     (2026.01)
    *H10W 72/00*     (2026.01)
    *H10W 72/50*     (2026.01)
    *H10W 90/00*     (2026.01)

(52) U.S. Cl.
    CPC ........................... *H10W 72/07552* (2026.01);
    *H10W 72/07553* (2026.01); *H10W 72/527*
    (2026.01); *H10W 72/537* (2026.01); *H10W*
    *90/754* (2026.01)

(56) References Cited

U.S. PATENT DOCUMENTS

| | | | | |
|---|---|---|---|---|
| 2003/0146509 | A1* | 8/2003 | Zhao | H01L 24/97 |
| | | | | 257/738 |
| 2004/0075166 | A1* | 4/2004 | Yang | H01L 24/49 |
| | | | | 257/E23.092 |
| 2007/0268675 | A1* | 11/2007 | Chinda | H05K 3/205 |
| | | | | 29/829 |
| 2008/0246135 | A1* | 10/2008 | Wong | H01L 25/105 |
| | | | | 257/E23.023 |
| 2010/0200898 | A1* | 8/2010 | Lin | H10F 77/50 |
| | | | | 257/E31.11 |
| 2012/0001306 | A1* | 1/2012 | Wang | H01L 21/4839 |
| | | | | 257/E21.503 |
| 2012/0097429 | A1* | 4/2012 | Chou | H01L 23/49811 |
| | | | | 257/E21.507 |
| 2013/0083503 | A1* | 4/2013 | Lai | H01L 21/4857 |
| | | | | 174/257 |
| 2013/0180651 | A1* | 7/2013 | Yen | H01L 21/486 |
| | | | | 156/247 |
| 2013/0292832 | A1* | 11/2013 | Tang | H01L 21/6835 |
| | | | | 257/738 |
| 2014/0284803 | A1* | 9/2014 | Lin | H01L 23/49894 |
| | | | | 257/773 |
| 2015/0155214 | A1* | 6/2015 | Lim | H01L 23/49838 |
| | | | | 29/827 |
| 2016/0049526 | A1* | 2/2016 | Oganesian | H10F 77/50 |
| | | | | 257/434 |
| 2016/0104738 | A1* | 4/2016 | Luan | H10F 39/806 |
| | | | | 257/432 |
| 2016/0212852 | A1* | 7/2016 | Hu | G06V 40/1318 |
| 2016/0329275 | A1* | 11/2016 | Park | H01L 23/49827 |
| 2017/0123101 | A1* | 5/2017 | Luan | G01V 8/12 |
| 2017/0140202 | A1* | 5/2017 | Huang | G06V 40/1329 |
| 2017/0194240 | A1* | 7/2017 | Park | H01L 23/49838 |
| 2020/0111829 | A1* | 4/2020 | Fan | H10F 39/011 |
| 2020/0343183 | A1* | 10/2020 | Chen | H01L 21/6835 |
| 2021/0257354 | A1* | 8/2021 | Liu | H01L 25/0657 |
| 2021/0335714 | A1* | 10/2021 | Yang | H01L 23/5384 |
| 2022/0384322 | A1* | 12/2022 | Kwon | H01L 24/19 |
| 2023/0005842 | A1* | 1/2023 | Kim | H01L 23/5383 |
| 2023/0011160 | A1* | 1/2023 | Kim | H01L 25/18 |
| 2023/0065941 | A1* | 3/2023 | Tsai | H01L 21/568 |
| 2023/0307404 | A1* | 9/2023 | Kuo | H01L 24/14 |
| 2023/0317585 | A1* | 10/2023 | Chiang | H01L 23/49822 |
| | | | | 257/690 |

* cited by examiner

ELECTRONIC PACKAGE, PACKAGE SUBSTRATE AND MANUFACTURING METHOD THEREOF

CROSS-REFERENCE TO RELATED APPLICATIONS

The present application is based upon and claims the right of priority to Taiwan Patent Application No. 111109058, having a filing date of Mar. 11, 2022, the disclosure of which is hereby incorporated by reference herein in its entirety for all purposes.

BACKGROUND

1. Technical Field

The present disclosure relates to a semiconductor package, and more particularly, to a package substrate with embedded traces and an electronic package made therefrom.

2. Description of Related Art with the vigorous development of the electronic industry, electronic products tend to be light, thin, short and small in form, while in terms of function, they tend to be high-performance, high-function, and high-speed research and development. Therefore, in order to meet the high integration and miniaturization requirements of semiconductor devices, package substrates with high-density and fine line spacing circuits are often used in the packaging process.

As shown in FIG. 1, a conventional package substrate 1 includes a plurality of conductive traces 11 disposed on an outermost dielectric layer 10, and a metal layer 12 such as nickel/gold formed on the outer surface of the conductive traces 11, so that the conductive trace 11 and the metal layer 12 form a circuit structure 1a.

However, in the conventional package substrate 1, the metal layer 12 is formed on a side surface 11c of each of the conductive traces 11, so that the metal layer 12 occupies the space between the conductive traces 11, causing each of the space widths between the circuit structures 1a (or the line spacing of the conductive traces 11) to be changed from the originally predetermined distance d1 between the side surfaces 11c of the conductive traces 11 to the distance d2 between the side surfaces 12c of the metal layers 12, which is reduced by about 10~20 microns (that is, d1–d2=10~20 microns). Thus, if the wiring is carried out at the originally predetermined distance d1, when the package substrate 1 is wired in the subsequent process, the adjacent conductive traces 11 are likely to be in contact with each other because the distance d2 between the metal layers 12 is too close, resulting in a short circuit.

Moreover, since the metal layer 12 occupies the space between the conductive traces 11 (so that making the surface shape present a circular arc), the bonding contacts on the adjacent conductive traces 11 are easily shifted, resulting in the wire bonding not being sticky-solid. Thus, when designing the circuit structure 1a, it is necessary to increase the distance d1 between the side surfaces 11c of the conductive traces 11 to avoid the problem of short circuit, but it also makes the package substrate 1 incapable of development of in the direction of fine spacing/fine lines, and thus it is difficult for the conventional package substrate 1 to meet the requirements for high-density contacts of semiconductor chips.

Therefore, how to overcome various problems of the above-mentioned prior art has become an urgent problem to be solved at present.

SUMMARY

In view of the various deficiencies of the prior art mentioned above, the present disclosure provides a package substrate, comprising an insulating portion; a circuit layer embedded in the insulating portion; and a surface treatment layer embedded in the insulating portion and coupled to a top surface of the circuit layer, wherein the surface treatment layer is free from being formed on a side surface of the circuit layer.

The present disclosure also provides a method for manufacturing a package substrate, the method comprising: providing an insulating portion; forming a circuit layer embedded in the insulating portion; and forming a surface treatment layer on a top surface of the circuit layer, wherein the surface treatment layer is free from being formed on a side surface of the circuit layer.

In the aforementioned package substrate and its manufacturing method, a surface of the surface treatment layer is flush with a surface of the insulating portion so that the surface treatment layer is exposed from the insulating portion.

In the aforementioned package substrate and its manufacturing method, the surface treatment layer is made of a conductive material.

The present disclosure further provides an electronic package, comprising: the package substrate mentioned above; and an electronic component disposed on the insulating portion and electrically connected to the circuit layer.

In the aforementioned electronic package, the electronic component is electrically connected to the circuit layer by wire bonding.

As can be seen from the above, in the electronic package and its package substrate of the present disclosure, the surface treatment layer is not formed on the side surface of the circuit layer so that the surface treatment layer does not occupy the side space of the circuit layer. Therefore, the side space of the circuit layer can maintain the originally predetermined line spacing. Hence, compared with the conventional technology, the package substrate of the present disclosure is wired with the originally predetermined line spacing, the package substrate is more flexible when the wiring process is performed in the subsequent manufacturing process. The adjacent welding wires will not be in contact, thereby avoiding the occurrence of short circuits.

Furthermore, since the surface treatment layer does not occupy the side space of the circuit layer, the line spacing of the circuit layer can be designed according to the requirements without increasing the line spacing, which can avoid the problem of the wire bonding not being stick-solid due to the wire bonding contacts being easily shifted. Therefore, compared with the prior art, the circuit layer of the package substrate of the present disclosure is conducive to the development of fine line spacing/fine circuit design, so as to meet the requirement of high-density contacts of semiconductor chips.

DETAILED DESCRIPTIONS

The following specific examples illustrate the implementation of the present disclosure, and those who are familiar with the art can easily understand other advantages and effects of the present disclosure from the contents disclosed in this specification.

It should be noted that the structures, proportions, sizes, and the like shown in the accompanying drawings are used for only the understanding and reading of those familiar with the skills in the art in conjunction with the contents disclosed in the specification, and are not intended to limit the conditions for the implementation of the present disclosure. The limited conditions for the implementation of the disclosure have no technical substantial meaning. Any modification of the structure, alteration of proportion, or adjustment of the size without affecting the effect and the purpose of the present disclosure should still fall within the scope compressed by the technical content disclosed in the present disclosure. At the same time, terms such as "above" and "a" used in this specification are only for the convenience of description and are not used to limit the scope of the present disclosure. The change or adjustment of their relative relationship without substantive change in the technical content should also be considered as the scope of the present invention that can be implemented.

Figure 1:
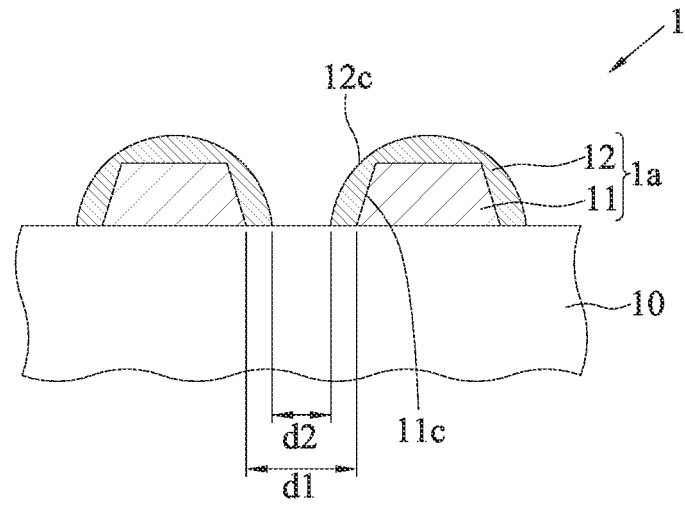
FIG. 1 is a schematic cross-sectional view of a conventional package substrate.
Figure 2:
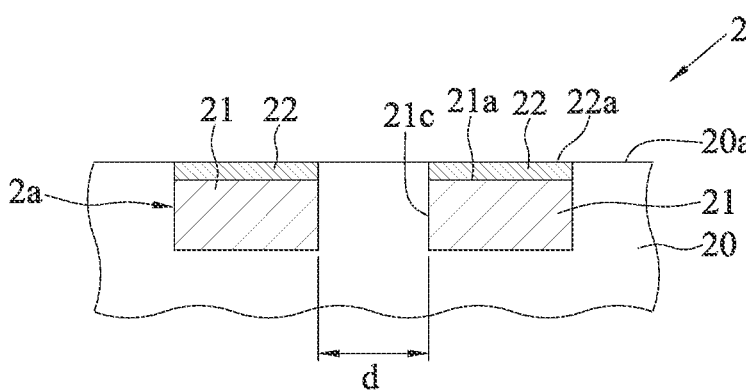
FIG. 2 is a schematic cross-sectional view of the package substrate of the present disclosure.

FIG. 2 is a schematic cross-sectional view of the package substrate 2 of the present disclosure. As shown in FIG. 2, the package substrate 2 includes an insulating portion 20, at least one circuit layer 2a, and a surface treatment layer 22.

The insulating portion 20 is a single insulating layer structure or a multilayer stacking insulating layer structure The insulating portion 20 is made of a dielectric material, such as Ajinomoto Build-up Film (ABF), Prepreg (PP) or others, and there is no specific limitation.

The circuit layer 2a is embedded in the insulating portion 20 and includes a plurality of conductive traces 21.

In this embodiment, a top surface 21a of the conductive trace 21 is lower than a surface 20a of the insulating portion 20.

The surface treatment layer 22 is embedded in the insulating portion 20 and coupled to on the top surface 21a of the circuit layer 2a, but not formed on side surfaces 21c of the conductive traces 21 of the circuit layer 2a.

In one embodiment, the surface 22a of the surface treatment layer 22 is flush with the surface 20a of the insulating portion 20 so that the surface treatment layer 22 is exposed from the insulating portion 20.

Moreover, the surface treatment layer 22 is made of nickel/gold (Ni/Au), nickel/palladium/gold (Ni/Pd/Au), organic solderability preservatives (OSP) or others.

Therefore, in the package substrate 2 of the present disclosure, because the surface treatment layer 22 is not formed on the side surfaces 21c of each of the conductive traces 21, the surface treatment layer 22 will not occupy the space between the conductive traces 21. Therefore, a space width between the side surfaces 21c of each of the conductive traces 21 (or the line spacing of the circuit layer 2a) maintains the original predetermined distance d. Hence, compared with the prior art, when the package substrate 2 of the present disclosure is wired at the originally predetermined distance d, when the package substrate 2 performs a wire-bonding process in the subsequent manufacturing process, the bonding wires 31 on the adjacent conductive traces 21 (as shown in FIG. 3) do not contact each other, thereby avoiding the occurrence of short circuits.

Furthermore, since the surface treatment layer 22 does not occupy the space between each of the conductive traces 21, the space width between the side surfaces 21c of each of the conductive traces 21 (or the line spacing of the circuit layer 2a) can be designed for the distance d between the side surfaces 21c according to the requirements, there is no need to increase the distance d between the side surfaces 21c of the conductive traces 21, thereby avoiding the problem that the wire bonding contacts on the adjacent conductive traces 21 are easily shifted and the wire bonding is not sticky-solid. Therefore, the circuit layer 2a of the package substrate 2 is conducive to the development of fine line spacing/fine circuit design, so as to meet the requirement of high-density contacts of semiconductor chips Also, since the surface treatment layer 22 is not formed on the side surface 21c of the circuit layer 2a, the amount of metal used in the package substrate 2 is less than that used in the conventional package substrate 1 under the same wiring amount. Therefore, the manufacturing cost of the package substrate 2 can be reduced.

Figure 3:
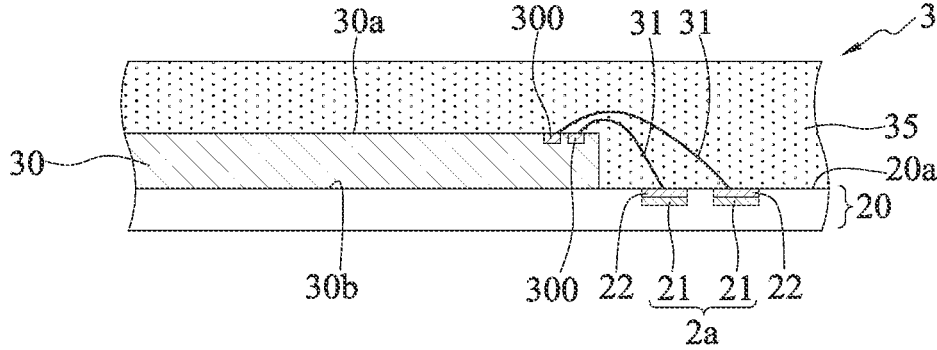
FIG. 3 is a schematic cross-sectional view of the electronic package of the present disclosure.

In addition, in subsequent applications, as shown in FIG. 3, the package substrate 2 can be bonded with at least one electronic component 30 on the surface 20a of the insulating portion 20 to form an electronic package 3.

The electronic component 30 is an active component, a passive component or a combination thereof, wherein the active component is a semiconductor chip, and the passive component is a resistor, capacitor and inductor.

The electronic component 30 is a semiconductor chip, which has an opposite active surface 30a and a non-active surface 30b, and a plurality of electrode pads 300 are arranged on the active surface 30a. And the electronic component 30 is coupled to the surface 20a of the insulating portion 20 with its non-active surface 30b. The electrode pads 300 are bonded to the surface treatment layer 22 with a plurality of bonding wires 31 in a manner of wire bonding to electrically connect the circuit layer 2a. A packaging material 35 is formed on the package substrate 2 to encapsulate the electronic component 30 and the bonding wires 31.

FIG. 4A to FIG. 4D are schematic cross-sectional views of the manufacturing method of the package substrate 2 of the present disclosure.

Figure 4A:
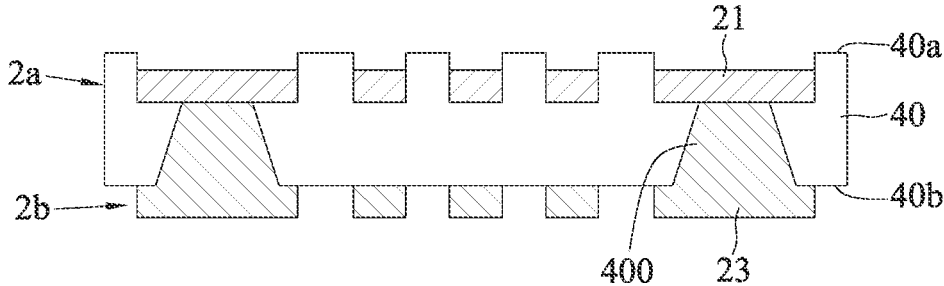
FIGS. 4A to 4D are schematic cross-sectional views of the manufacturing method of the package substrate of the present disclosure.

As shown in FIG. 4A, a wiring process is performed on an insulating portion 40 in a patterned manner to form a plurality of circuit layers 2a, 2b.

In this embodiment, the insulating portion 40 has opposite first side 40a and second side 40b. The wiring on the first side 40a to form the circuit layer 2a embedded in the insulating portion 40 in a manner of etching metal, and the wiring on the second side 40b is to form the circuit layer 2b on the surface of the insulating portion 40 in a manner of electroplating metal. A plurality of conductive blind holes 400 are formed in the insulating portion 40 to electrically connect to the circuit layers 2a, 2b of the first side 40a and the second side 40b.

Furthermore, the circuit layer 2a on the first side 40a includes a plurality of conductive traces 21, and the circuit layer 2b on the second side 40b has a plurality of electrical connection pads 23.

Figure 4B:
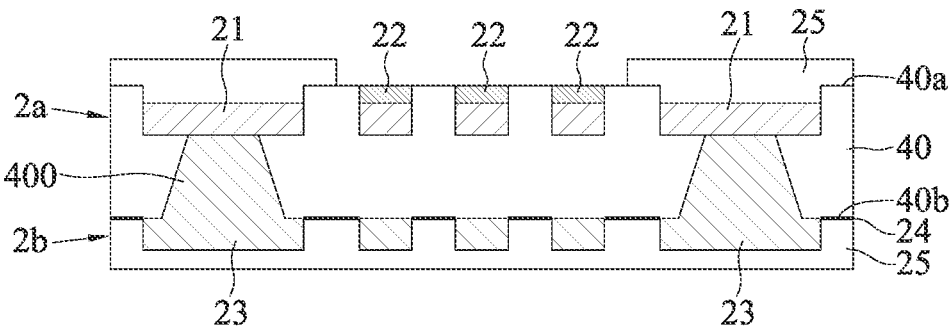

As shown in FIG. 4B, a conductive layer 24 is first formed on a insulating surface of the second side 40b, and then a patterned resist layer 25 such as a photoresist is formed to cover the first side 40a and the second side 40b of the insulating portion 40, to expose part of the surface of the circuit layer 2a of the first side 40 on the resistance layer 25. After that, a surface treatment layer 22 is electroplated on the exposed surface of the conductive trace 21 of the circuit layer 2a through the conductive layer 24, so that the surface of the surface treatment layer 22 is flush with the surface of the insulating portion 40.

Figure 4C:
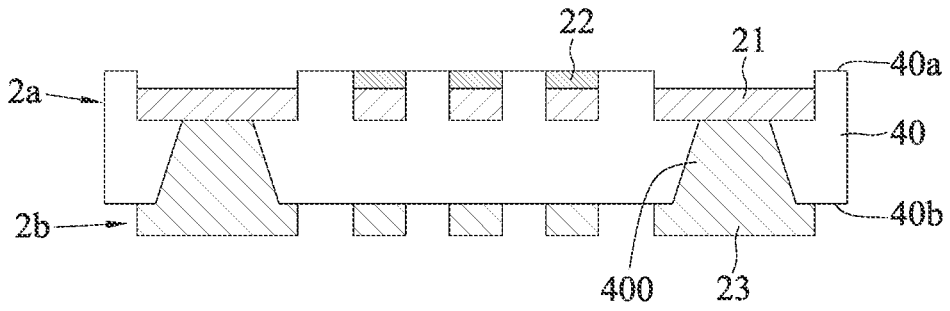

As shown in FIG. 4C, the resistive layer 25 and the conductive layer 24 are removed, so that the surface treatment layer 22 is exposed on the insulating portion 40.

Figure 4D:
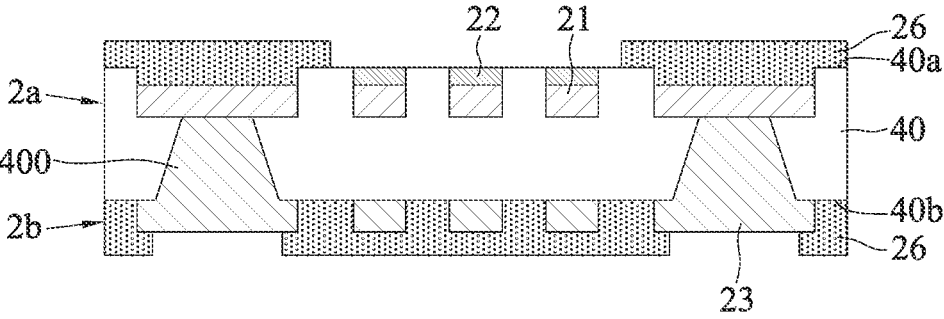

As shown in FIG. 4D, an insulating protective layer 26 such as a solder resist layer is formed on the first side 40a and the second side 40b of the insulating portion 40. The surface treatment layer 22 and the electrical connection pad 23 are exposed from the insulating protection layer 26.

To sum up, in the package substrate of the present disclosure, the circuit layer is embedded in the insulating portion, and the surface treatment layer is not formed on the side surface of the circuit layer. Therefore, the space width between the side surfaces of the conductive traces (or the line spacing of the circuit layer) is maintained at the original predetermined distance, so the package substrate of the present disclosure can not only avoid the problem of short circuit, but also facilitate the development of fine line spacing/fine circuit design development.

The above-mentioned embodiments are used to illustrate the principles of the present disclosure and their effects, but not to limit the present disclosure. Any person skilled in the art can modify the above-mentioned embodiments without departing from the spirit and scope of the present disclosure. Therefore, the scope claimed by the present disclosure should be as described by the accompanying claims listed below.

6

What is claimed is:

1. A package substrate, comprising:
an insulating portion;
a circuit layer embedded in the insulating portion; and
a surface treatment layer embedded in the insulating portion and coupled to a top surface of the circuit layer, wherein the surface treatment layer is free from being formed on a side surface of the circuit layer, wherein a surface of the surface treatment layer is flush with a surface of the insulating portion, and wherein the surface treatment layer is made of nickel/gold (Ni/Au), nickel/palladium/gold (Ni/Pd/Au), or organic solderability preservatives (OSP).

2. The package substrate of claim 1, wherein the surface treatment layer is exposed from the insulating portion.

3. An electronic package, comprising:
the package substrate of claim 1; and
an electronic component disposed on the insulating portion and electrically connected to the circuit layer.

4. The electronic package of claim 3, wherein the electronic component is electrically connected to the circuit layer by wire bonding.

5. A method for manufacturing a package substrate, the method comprising:
providing an insulating portion;
forming a circuit layer embedded in the insulating portion; and
forming a surface treatment layer on a top surface of the circuit layer, wherein the surface treatment layer is free from being on a side surface of the circuit layer, wherein a surface of the surface treatment layer is flush with a surface of the insulating portion, and wherein the surface treatment layer is made of nickel/gold (Ni/Au), nickel/palladium/gold (Ni/Pd/Au), or organic solderability preservatives (OSP).

6. The method of claim 5, wherein the surface treatment layer is exposed from the insulating portion.

* * * * *